United States Patent
Narang et al.

(10) Patent No.: US 8,686,777 B1
(45) Date of Patent: Apr. 1, 2014

(54) METHODS AND CIRCUITS FOR ENABLING SLEW RATE PROGRAMMABILITY AND COMPENSATION OF INPUT/OUTPUT CIRCUITS

(71) Applicant: Texas Instruments Incorporated, Dallas, TX (US)

(72) Inventors: Vikas Narang, Bangalore (IN); Abhishek Chakraborty, Bangalore (IN); Nagalinga Swamy Basayya Aremallapur, Haveri (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/733,571

(22) Filed: Jan. 3, 2013

(51) Int. Cl.
*H03H 11/26* (2006.01)

(52) U.S. Cl.
USPC .......................... 327/261; 327/276; 327/298

(58) Field of Classification Search
USPC .............. 327/171–175, 261–263, 270–271, 327/276–277, 291, 298
See application file for complete search history.

(56) References Cited

U.S. PATENT DOCUMENTS

| | | | |
|---|---|---|---|
| 6,590,434 B2 * | 7/2003 | Chung et al. | 327/277 |
| 7,782,109 B2 * | 8/2010 | Ma et al. | 327/276 |
| 7,809,077 B2 * | 10/2010 | Ikramov et al. | 375/295 |

\* cited by examiner

*Primary Examiner* — An Luu
(74) *Attorney, Agent, or Firm* — Wade J. Brady, III; Frederick J. Telecky, Jr.

(57) ABSTRACT

Various embodiments of circuits and methods for enabling a slew rate programmability and compensation of input/output circuits are provided. The circuit includes a delay code generation circuit and at least one input/output (I/O) circuit. The delay code generation circuit is configured to receive a clock signal and a delay factor and generate a compensated delay code based on the clock signal or a combination of the delay factor and the clock signal. The I/O circuit includes a plurality of delay lines associated, integrated or communicatively associated with the delay code generation circuit and is configured to program the plurality of delay lines so as to generate a predetermined delay corresponding to the compensated delay code in order to achieve a predetermined slew rate of the I/O circuit.

20 Claims, 3 Drawing Sheets

METHODS AND CIRCUITS FOR ENABLING SLEW RATE PROGRAMMABILITY AND COMPENSATION OF INPUT/OUTPUT CIRCUITS

TECHNICAL FIELD

The present disclosure generally relates to input/output circuits.

BACKGROUND

With an increase in the number of functions-per-chip, there is a corresponding increase in (1) the amount of bandwidth to be implemented and (2) the utilization of a high operational frequency for input/output (I/O) circuits. Also, it may be helpful to maintain low power budgets, low cost and low area for I/O circuits, especially for battery operated mobile devices. The high operational frequencies of the I/O circuits lead to fast rise and fall times of signals associated with the I/O circuits. At slow process corners (e.g., process, temperature and voltage parameters), the I/O circuits may be over-sized so as to achieve high operational frequencies. However, at fast process corners, the high operational frequencies may lead to electro-magnetic induction (EMI), crosstalk, ringing, reflection, and/or power and ground bounce, which can degrade reliability of an I/O circuit. Process, temperature, and voltage (PTV) compensation may be utilized in certain circuits to tackle the above-mentioned issues. However, in the case of I/O circuits, the PTV compensation alone may not suffice, as the same I/O circuit may be used in different boards with different loading scenarios. Designing the I/O circuits for the worst case load scenario may lead to fast transition rates and EMI issues at low load scenarios.

In some exemplary scenarios, the above-mentioned issues may be mitigated by making a rise/fall time of an output signal of the I/O circuit programmable or load independent. However, making the rise/fall time programmable or load independent may lead to a compromise on performance, area and/or power. Further the achievable rise/fall time may be (1) rendered granular and (2) affected by a number of programming bits. Moreover, providing programmability within a few pre-defined levels of rise/fall time may not control EMI effectively due to the achievable rise/fall time being granular and affected by the number of programming bits. The achievable rise/fall time determines a slew rate of the I/O circuit. Several exemplary scenarios provide a slew rate compensation for a wide range of load values through miller feedback. However, miller feedback based techniques may negatively impact the performance and area of the I/O circuits. Also, several exemplary scenarios implement an external resistor for PTV compensation. However, using external resistors for PTV compensation can result in an increase in cost. Moreover, several exemplary scenarios use a common calibration for p-type metal oxide semiconductor (PMOS) and n-type metal oxide semiconductor (NMOS) based I/O circuits, and a specific calibration may not work with a skewed process. Furthermore, several exemplary scenarios are based on analog techniques that (1) are not suitable for low-power applications and (2) provide a low degree of programmability.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A number of exemplary circuits and methods for enabling slew rate programmability and compensation of input/output circuit are disclosed herein. In an embodiment, a circuit includes a delay code generation circuit and at least one input/output (I/O) circuit. The delay code generation circuit is configured to receive a clock signal and a delay factor and generate a compensated delay code based on the clock signal or a combination of the delay factor and the clock signal. The compensated delay code is compensates for at least one of a process variation, a temperature variation, and a voltage variation. The at least one I/O circuit includes a slave delay circuit and at least one I/O slice communicatively associated, integrated or coupled with the slave delay circuit. The slave delay circuit includes a plurality of delay lines, associated, integrated or coupled with the delay code generation circuit that may be implemented to receive the compensated delay code. The at least one I/O circuit is configured to program the plurality of delay lines to generate a predetermined delay corresponding to the compensated delay code so as to achieve a predetermined slew rate of the at least one I/O circuit.

The predetermined slew rate achieved based on the compensated delay code is compensated for at least one of a process variation, a temperature variation, and voltage variation. The slave delay circuit, including the plurality of delay lines, is configured to generate the predetermined delay corresponding to the compensated delay code. The at least one I/O slice is communicatively associated, integrated or coupled with the slave delay circuit, wherein the at least one I/O slice is configured to generate the predetermined slew rate based on the predetermined delay.

Additionally in an embodiment, a circuit includes a delay code generation circuit and at least one I/O circuit communicatively associated, integrated or coupled with the delay code generation circuit. The delay code generation circuit is configured to receive a clock signal and a delay factor and to generate a compensated delay code based on the clock signal or a combination of the delay factor and the clock signal. The compensated delay code compensates for at least one of on a process variation, a temperature variation, and a voltage variation. The at least one I/O circuit is communicatively associated, integrated or coupled with the delay code generation circuit and includes a plurality of delay lines and communicatively associated, integrated or coupled with the delay code generation circuit that may be implemented to receive the compensated delay code. The at least one I/O circuit is configured to program the plurality of delay lines to generate a predetermined delay corresponding to the compensated delay code so as to achieve a predetermined slew rate of the at least one I/O circuit. The at least one I/O circuit includes a slave delay circuit and an I/O block communicatively associated, integrated or coupled with the slave delay circuit. The slave delay circuit includes the plurality of delay lines.

Each of the plurality of delay lines are configured to generate the predetermined delay corresponding to the compensated delay code. The I/O block is communicatively associated, integrated or coupled with the slave delay circuit, wherein the at least one I/O block is configured to generate the predetermined slew rate based on the predetermined delay or a combination of an impedance of the at least one I/O circuit and the predetermined delay. The predetermined slew rate is compensated for at least one of a process variation, a temperature variation, and a voltage variation. The I/O block includes a plurality of slice groups, wherein each of the plurality of slice groups includes at least one I/O slice. Each I/O slice is configured to be turned ON or activated based on an input from a delay line of the plurality of the delay lines. Each slice group of the plurality of slice groups has a distinct delay based on the input from the delay lines of the plurality of delay lines.

Moreover, in an embodiment, a method of enabling a slew rate programmability of an I/O circuit includes receiving a clock signal and a delay factor. The method also includes generating a compensated delay code corresponding to a predetermined delay based on the clock signal or a combination of the delay factor and the clock signal. The compensated delay code compensates for at least one of a process variation, a temperature variation, and a voltage variation. The delay code generation circuit is calibrated to provide a plurality of delays based on the process variation, the temperature variation, the voltage variation and the received clock signal. At least one of a clock period of the received clock signal and the delay factor are adjusted to generate the compensated delay code corresponding to the predetermined delay, wherein the predetermined delay is a ratio of the clock period of the clock signal and the delay factor.

Additionally, the method includes providing the compensated delay code to the I/O circuit. The method also includes generating the predetermined delay in at least one signal path of the I/O circuit based on the compensated delay code so as to achieve a predetermined slew rate of the I/O circuit based on the predetermined delay or a combination of an impedance of the I/O circuit and the predetermined delay. The predetermined slew rate is compensated for at least one of a process variation, a temperature variation, a voltage variation. In an embodiment, the generated compensated delay code is decoded. The decoded compensated delay code is provided to a slave delay circuit of the I/O circuit. In an embodiment, the clock signal is divided so as to derive a code update signal. The compensated delay code is provided to the slave delay circuit along with the code update signal such that the compensated delay code is updated during each falling edge from among a plurality of falling edges of the code update signal.

DETAILED DESCRIPTION

Various embodiments of the present technology provide circuits and methods for enabling slew rate programmability and compensation for I/O circuits. The following description and accompanying figures demonstrate that the present technology may be practiced or otherwise implemented in a variety of different embodiments. It should be noted, however, that the scope of the present technology is not limited to any or all of the embodiments disclosed herein. Indeed, one or more of the devices, features, operations, processes, characteristics, or other qualities of a disclosed embodiment may be removed, replaced, supplemented, or changed.

Figure 1:
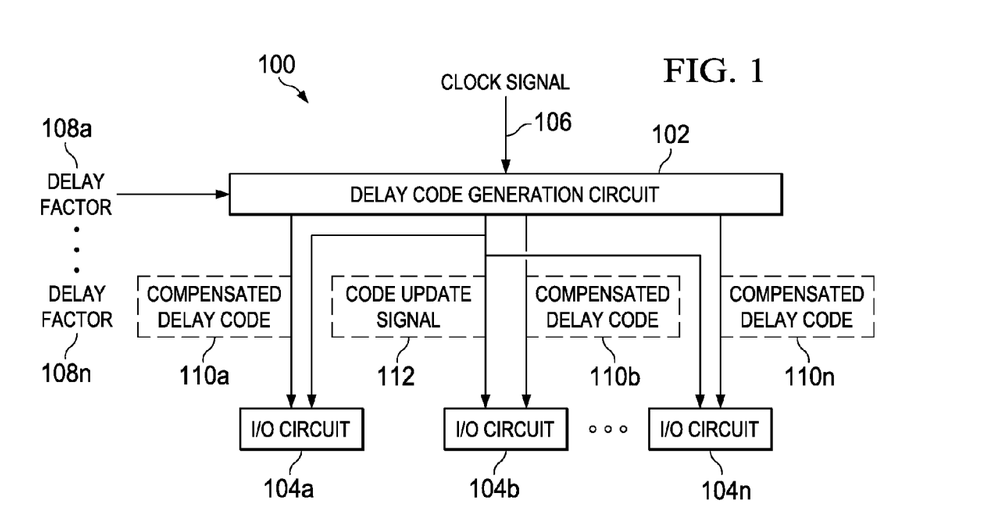
FIG. 1 is a block diagram representation of an exemplary circuit configured to enable a slew rate programmability and compensation of an input/output (I/O) circuit, according to an embodiment.

FIG. 1 is a block diagram representation of an exemplary circuit 100 configured to enable a slew rate programmability and compensation of an input/output (I/O) circuit according to an embodiment. It is noted that the terminology "slew rate" may refer to, for example, a rate of change of output voltage corresponding to various signal paths of the I/O circuit or a rate of charging or discharging of a load connected to the I/O circuit. As illustrated in FIG. 1, in an embodiment, the circuit 100 includes a delay code generation circuit 102 communicatively associated, integrated or coupled with a plurality of I/O circuits (104a-104n). In some embodiments, the delay code generation circuit 102 may include a delay circuit in combination with a number of combinational and sequential logic blocks. Examples of the delay code generation circuit 102 include, but are not limited to, a delay locked loop, a delay line, and a plurality of delay lines connected or coupled in series. Examples of the I/O circuits (e.g., 104a-104n) include, but are not limited to, I/O drivers. The delay code generation circuit 102 is configured to receive a clock signal 106 and a delay factor (e.g., 108a-108n). The delay code generation circuit 102 is configured to generate a compensated delay code (e.g. 110a-110n) based on the clock signal 106 or a combination of the clock signal 106 and the delay factor (e.g., 108a-108n). It is noted that the term "compensated delay code" is construed as referring to a delay code that compensates for a process variation, a temperature variation, and/or a voltage variation.

In an embodiment, the delay factor (e.g., 108a-108n) is associated with a clock period of the clock signal 106 and a predetermined delay associated with a predetermined slew rate of an I/O circuit (e.g., 104a). In an embodiment, the predetermined delay is a ratio of the clock period of the clock signal 106 and the delay factor (e.g., 108a-108n). Examples of the delay factor (e.g., 108a-108n), include, but are not limited to, a division factor and a multiplying factor. In an embodiment, the delay code generation circuit 102 may also include a delay modification circuit for performing one or more mathematical operations on the compensated delay code to generate a modified compensated delay code based on the delay factor (e.g., 108a-108n). The mathematical operations may include division (e.g., binary division), multiplication (e.g., binary multiplication), addition, subtraction, and other similar mathematical operations. Examples of the delay modification circuit may include, but is not limited to an integer divider configured through combinational and/or sequential logic blocks.

In an embodiment, the delay modification circuit may include one or more sequential or combinational logic blocks, including, for example, an adder, a multiplier, and the like. The delay factor (e.g., 108a-108n) and/or the clock period of the clock signal 106 may be adjusted to generate various compensated delay codes (e.g., 110a-110n). For example, a compensated delay code 110a is generated corresponding to a delay factor 108a, a compensated delay code 110b is generated corresponding to a delay factor 108b, and a compensated delay code 110n is generated corresponding to a delay factor 108n.

In an embodiment, the compensated delay code is a binary code. The compensated delay code may be, for example, an eight bit code, a sixteen bit code, and the like. The delay code generation circuit 102 is configured to generate the compensated delay code (e.g., 110a) based at least one of the process variation, the temperature variation, and/or the voltage variation. In an embodiment, the delay code generation circuit 102 is calibrated or configured to generate various compensated delay codes (e.g., 110a-110n). The compensated delay codes are generated based on the calibration or configuration, and are provided to the I/O circuits (e.g., 104a-104n) so as to generate corresponding delays therein in order to achieve a predetermined slew rate in the signal paths of the I/O circuits (e.g., 104a-104n) so that the predetermined slew rate is compensated for the process variation, the temperature variation, and/or the voltage variation.

In an embodiment, each compensated delay code corresponds to the predetermined delay associated with the predetermined slew rate of one or more of the I/O circuits (e.g., 104a-104n). In an example, if the predetermined delay required for the slew rate compensation is 1.2 nanoseconds (ns), the delay factor is programmed or configured to obtain a compensated delay code corresponding to a delay of 1.2 ns. In this example, if a clock period of the clock signal 106 is 100 ns, the delay code generation circuit 102 is calibrated or configured for 100 ns and generates a code corresponding to 100 ns based on the calibration or configuration. In accordance with an example, the code carries information of a number of delay elements that are to be turned ON or activated in order to achieve a delay of 100 ns. The code generated is converted to a compensated delay code corresponding to 1.2 ns by dividing the code by a ratio of the clock period and the predetermined delay (e.g., 100/1.2, which is approximately equivalent to 83.33). A delay factor that is, for example, substantially equal to 83.33 is selected to generate the compensated delay code corresponding to 1.2 ns.

In an embodiment, each compensated delay code is transmitted to one or more of the plurality of I/O circuits (e.g., 104a-104n) to introduce a delay corresponding to the predetermine delay in an input signal of the corresponding I/O circuit. By introducing the delay in the input signal of the I/O circuit, the predetermined slew rate of the I/O circuit may be achieved. A plurality of slew rates may be achieved using a plurality of different compensated delay codes. The slew rate of the I/O circuit is a function of the predetermined delay or a combination of the predetermined delay and an impedance of the I/O circuit. The predetermined delay and/or the impedance may be selectable based on the predetermined slew rate to be achieved. The value of the delay factor is programmable based on the predetermined delay and/or the predetermined slew rate that is to be achieved. By programming the value of the delay factor, a large number of slew rates may be achieved.

In an embodiment, the I/O circuit includes a slave delay circuit including a plurality of delay lines. Each of the plurality of delay lines includes one or more delay elements. Examples of the delay elements, may include, but are not limited to, buffers, flip flops, programmable logic devices, and logic gates. The I/O circuit is configured to program the delay lines so as to generate the predetermined delay corresponding to the predetermined slew rate of the I/O circuit. In an embodiment, the delay code generation circuit 102 is communicatively associated, integrated or coupled with the slave delay circuit of the I/O circuit and the compensated delay code generated is fed into the slave delay circuit from the delay code generation circuit 102. The compensated delay code determines a number of delay elements to be turned ON in each of the plurality of slave delay lines so as to generate the predetermined delay through each of the plurality of delay lines of the slave delay circuit. The I/O circuit is configured to program the plurality of delay lines so as to generate the predetermined delay corresponding to the compensated delay code in order to achieve the predetermined slew rate of the I/O circuit. As the compensated delay code is generated through the delay code generation circuit 102 based on the process variation, temperature variation, and/or voltage variation, the predetermined delay generated through the slave delay circuit based on the compensated delay code is consequently compensated for at least one of the process variation, the temperature variation, and/or a voltage variation.

In an embodiment, an I/O circuit includes a plurality of I/O slices. In an embodiment, the plurality of I/O slices may be configured in a plurality of rows and columns. One or more rows and/or columns of the I/O slices are turned ON or activated at various instances based on one or more multiples of the predetermined delay corresponding to the compensated delay code so as to achieve the predetermined slew rate. Upon successively turning ON or activating the I/O slices, the output signal of the I/O circuit appears as a stepped waveform, such as explained further herein with reference to FIG. 2A and FIG. 2B. As the predetermined delay is a ratio of the clock period of the clock signal 106 and the delay factor 108, the slew rate of the I/O circuit may be varied, such as pursuant to an application specification, by varying the delay factor (e.g., 108a) and/or the clock period of the clock signal 106. The slew rate of the I/O circuit is also a function of an impedance of the I/O circuit. In an embodiment, the impedance of the I/O circuit may also be varied in addition to delay factor 108 and/or the clock period of the clock signal 106 to vary the slew rate of the I/O circuit. In an embodiment, the clock signal 106 is divided and fed into the delay code generation circuit 102 to overcome duty cycle issues. In an embodiment, the delay code generation circuit 102 is configured to divide the clock signal 106, such as to divide the clock signal 106 into half (e.g., clock signal/2), to generate a code update signal 112. In an embodiment, the code update signal 112 is applied to each of the plurality of I/O circuits (e.g., 104a-104n), such that the compensated delay code (e.g., 110a-110n) is generated during a falling edge of the code update signal 112 and the compensated delay code (e.g., 110a-110n) is captured by each of the plurality of I/O circuits (e.g., 104a-104n) during a rising edge of the code update signal 112.

The circuit 100 of FIG. 1 enables a dynamic provision of a plurality of compensated delay codes to the I/O circuits (e.g., 104a-104n) so as to reduce a variation of the slew rate associated with the I/O circuits (e.g., 104a-104n) across process, temperature, and/or voltage variations. In an embodiment, in addition to the compensated delay code, I/O circuits (e.g., 104a-104n) may be configured to receive a process temperature voltage code (referred to herein after as PTV code) configured to vary an impedance of the I/O circuits (e.g., 104a-104n). It is noted that the terminology "PTV code" may be construed as referring to a code configured to compensate for at least one of a process variation, a temperature variation, and/or a voltage variation. The PTV code enables an impedance programmability and compensation of the I/O circuits (e.g., 104a-104n). The PTV code may be, for example, an e-fuse code. It is noted that the terminology "e-fuse" may be construed as referring to, a technology that allows for the dynamic real-time reprogramming of electronic chips by etching or hard-coded a logic onto the electronic chip and cannot be changed after the electronic chip has been manufactured. The slew rate of an I/O circuit is a function of the impedance and the predetermined delay generated based on the compensated delay code. Variation of the impedance of the I/O circuit based on the PTV code brings in a variation in the slew rate of the I/O circuit in addition to the variation caused by the variation in the predetermined delay associated with the compensated delay code. In an embodiment, the compensated delay code and the PTV code jointly enable slew rate programmability of the I/O circuits (e.g., 104a-104n).

In an embodiment, a drive strength of the I/O circuit is programmable through the PTV code. It is noted that the terminology "drive strength" may be construed as referring to, for example, a maximum current that a pin of the I/O circuit is capable of driving. The drive strength of the I/O circuit may be process, temperature, and/or voltage compensated based on the PTV code. A selection code may be generated based on the PTV code and the drive strength setting of the I/O circuit. In an embodiment, the selection code is fed into the I/O circuit so as to select I/O slices that are turned ON or activated within the I/O circuit based on the selection code. In an embodiment, turning ON or activating the selected I/O slices causes a variation in the impedance of the I/O circuit. By changing the PTV code, and thereby changing the selection code, the impedance of the I/O circuit may be varied.

Figure 2A:
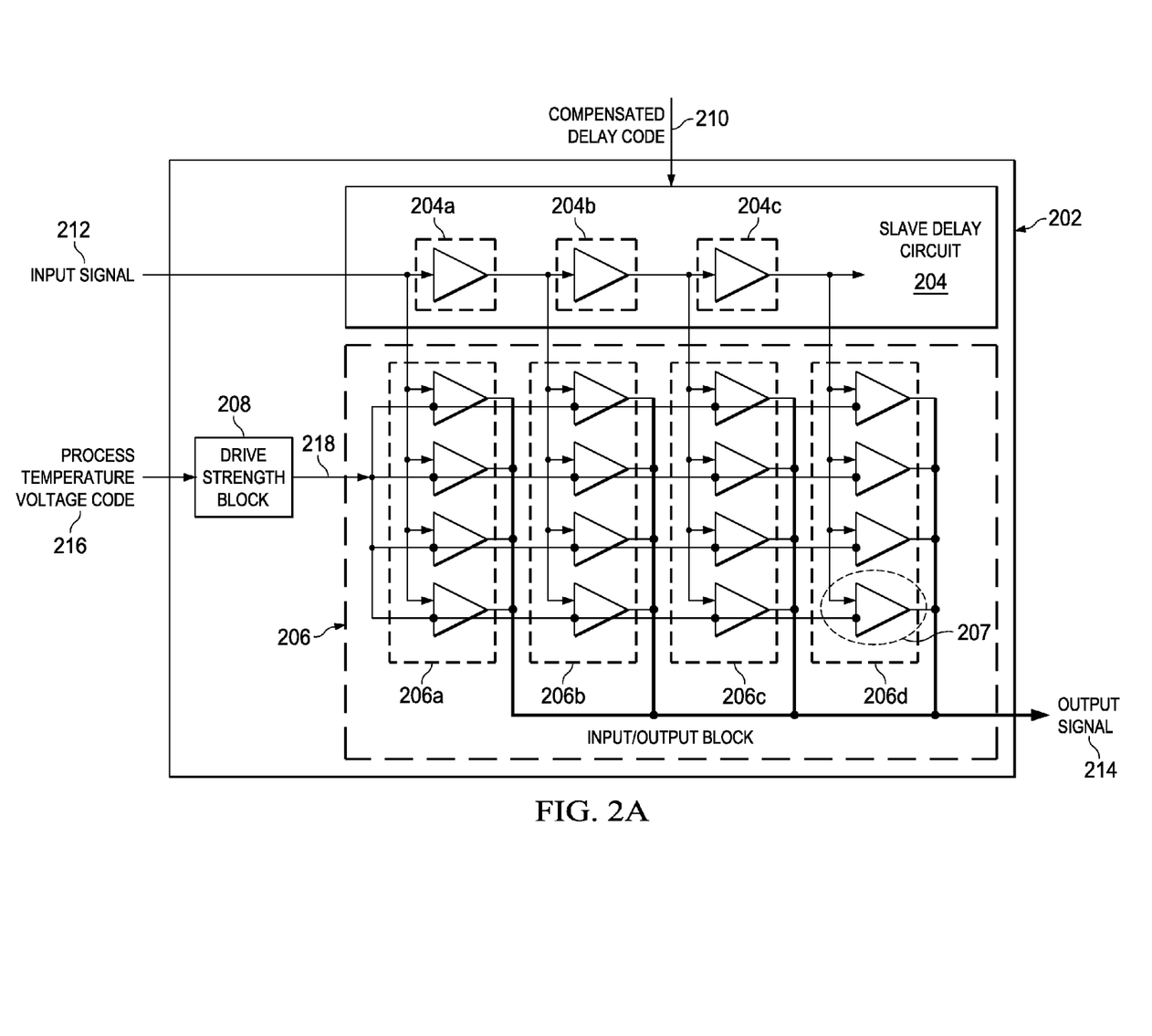
FIG. 2A is a block diagram representation of the I/O circuit of the exemplary circuit of FIG. 1, according to an embodiment.

FIG. 2A is a block diagram representation of the I/O circuit of exemplary circuit 100 of FIG. 1 according to an embodiment. In an embodiment, the I/O circuit 202 of FIG. 2A includes a slave delay circuit 204, an I/O block 206, and/or a drive strength block 208. The slave delay circuit 204 is configured to receive a compensated delay code 210 from a delay code generation circuit (e.g., delay code generation circuit 102 of FIG. 1). In an embodiment, the slave delay circuit 204 is configured to receive a decoded form of the compensated delay code 210. In an embodiment, the slave delay circuit 204 includes one or more delay lines, such as, for example, delay lines 204a, 204b, and 204c. Each of the delay lines (e.g., 204a, 204b, and 204c) may include one or more delay elements. Examples of the delay elements may include, but are not limited to, buffers, flip flops, programmable logic devices, and logic gates. In an embodiment, delay lines (e.g., 204a-204c) are configured to generate a predetermined delay corresponding to the compensated delay code 210 upon receiving the compensated delay code 210. The compensated delay code 210 corresponds to a number of delay elements to be turned ON or activated in each of the delay lines (e.g., 204a-204c) so as to generate the pre-determine delay through each of the delay lines (e.g., 204a-204c) in order to achieve a predetermined slew rate. In an embodiment, an input terminal of each of the delay lines (e.g., 204a-204c) is communicatively associated, integrated or coupled with the I/O block 206.

In an embodiment, the I/O block 206 includes a plurality of slice groups, such as, for example, slice groups 206a-206d. As shown in FIG. 2A, the plurality of slice groups (e.g., 206a-206d) are configured in separate columns. In an embodiment, the plurality of slice groups (e.g., 206a-206d) is configured in a serial manner. Each of the slice groups (e.g., 206a-206d) includes at least one I/O slice (see, e.g., I/O slice 207). In the I/O block 206, four slice groups (e.g., 206a-206d) are shown for purposes of illustration; however, the I/O block 206 can include any number of slice groups configured in separate columns. Furthermore, four slices (see, e.g., I/O slice 207) are shown in each of the slice groups (e.g., 206a-206d) for purposes of illustration; however, a slice group (e.g., 206a-206d) can include any numbers of slices. In an embodiment, each I/O slice (e.g., slice I/O slice 207) receives a first input from an input of one of the plurality of delay lines (e.g., 204a-204c) and receives a second input from the drive strength block 208. In an embodiment, the slave delay circuit 204 is connected to the plurality of slice groups (e.g., 206a-206d) such that the slave delay circuit 204 introduces a distinct delay for each of the plurality of slice groups (e.g., 206a-206d).

For example, a particular number of delay lines (which may cause a particular delay) are applied in a path between an input signal 212 and an output 214 through a particular slice group. In this example, the input signal 212 is propagated to the output 214 through the slice group 206b with a delay introduced by the delay line 204a. Furthermore, the input signal 212 is propagated to the output 214 through the slice group 206c with a combined delay introduced by delay lines 204a and 204b. Similarly, the input signal 212 is propagated to the output 214 through the slice group 206d with a combined delay introduced by delay lines 204a, 204b and 206c. As illustrated in FIG. 2A, each I/O slice from among the plurality of slice groups (e.g., 206a-206d) receives a pair of inputs and generates an output. Each I/O slice receives a first input of the pair of inputs from an input of one of the delay lines (e.g., 204a-204c).

Figure 2B:
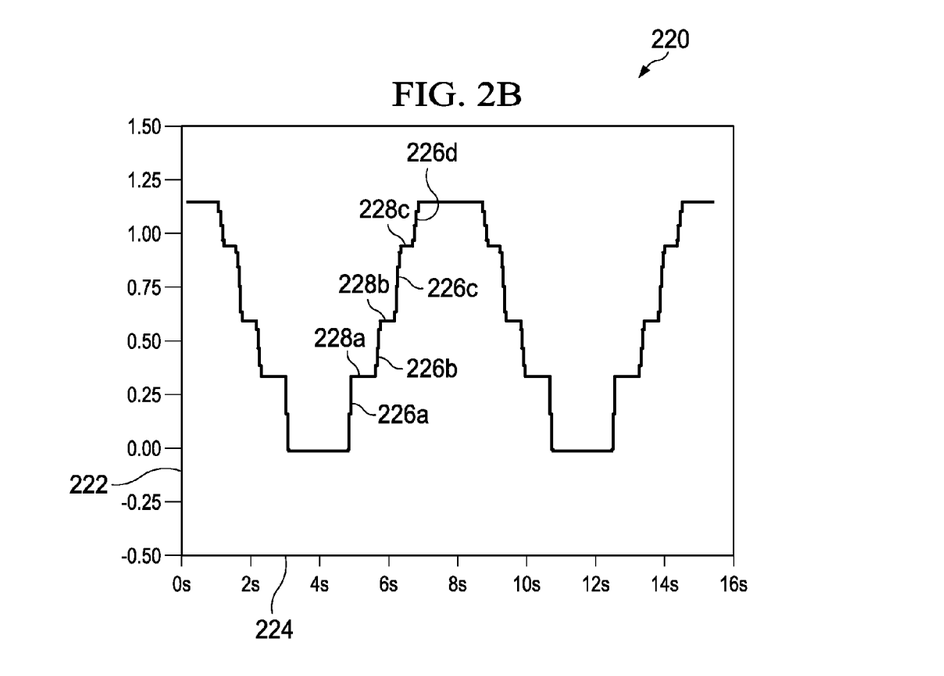
FIG. 2B illustrates a waveform of an exemplary output signal of the I/O circuit of FIG. 2A, according to an embodiment.

Each of the plurality of delay lines (204a-204c) is configured to generate a delay (for example, 'd' time units) based on the compensated delay code 210. In an embodiment, the delay lines 204a, 204b, and 204c are configured to generate various delays (for example, 'd1', 'd2', and 'd3' time units respectively) based on the compensated delay code 210, such that the delay generated through each of the delay lines 204a, 204b, and 204c is individually controlled based on the compensated delay code 210. In an embodiment, the delay lines (204a-204c) are communicatively associated, connected, or coupled in a serial manner. Upon receiving the input signal 212, the first slice group 206a is turned ON or activated. Since an input of the delay line 204b (or an output of the delay line 204a) is coupled or selected as the first input of the second slice group 206b, the second slice group 206b is tuned ON or activated after the delay of d time units generated by the delay line 204a. Similarly, a third slice group 206c is tuned ON or activated after the delay of d time units subsequent to turning ON or activating the second slice group 206b. The sequential turning ON or activation of the slice groups (206a-206d) leads to generation of a stepped waveform as an output signal 214 of the I/O circuit 202. Upon increasing the delay d, the slew rate of the I/O circuit 202 decreases. The waveform of the output signal 214 is as illustrated in FIG. 2B.

The drive strength block 208 is configured to provide a drive strength setting for the I/O circuit 202. In an embodiment, the drive strength block 208 is configured to receive a PTV code 216 and output a selection code 218 to the I/O block 206. The selection code 218 is generated through the drive strength block 208 based on the PTV code 216 and the drive strength setting. An example of the PTV code 216 may include an e-fuse code. In an embodiment, the PTV code 216 may be provided based on a device configuration, such as PMOS or NMOS devices present in the I/O block 206. The drive strength of the I/O circuit 202 may be process compensated based on the PTV code 216. In an embodiment, the selection code 218 is a binary code. The selection code 218 includes information indicative of one or more I/O slices in the I/O block 206 to be tuned ON or activated based on the drive strength setting. In an embodiment, the selection code 218 includes a value indicative of a number of I/O slices to be turned ON or activated. In an embodiment, the selection code 218 includes information associated with specific I/O slices to be turned ON or activated. For example, the selection code 218 may indicate that five I/O slices are to be turned ON or activated, with one I/O slice to be turned ON or activated in each of the slice groups 206a, 206b, and 206c, and with a pair of I/O slices to be turned ON or activated in the slice group 206d.

Pursuant to one embodiment, an impedance of the I/O circuit 202 is determined by the number of I/O slices tuned ON or activated at a given instant. In an embodiment, by varying the selection code 218, the impedance of the I/O circuit 202 may be varied. As the predetermined number of I/O slices in the I/O block 206 are turned ON or activated based on the selection code 218, the selection code 218 enables an impedance programmability for the I/O circuit 202. As the selection code 218 is process compensated, the selection code 218 also enables an impedance compensation of the I/O circuit 202. The selection code 218 serves as the second input of the pair of inputs for each of the plurality of I/O slices in the I/O block 206. In an embodiment, a separate PTV code is provided from each of p-type metal oxide semiconductor (PMOS) transistors based I/O slices and n-type metal oxide semiconductor (NMOS) transistors based I/O slices.

A suitable number of I/O slices may be turned on or activated separately for each of the PMOS transistors and NMOS transistors based on the separate PTV codes. In an embodiment, upon turning ON or activating a selected number of I/O slices based on the selection code 218, the output signal 214, which has an exemplary waveform 220 as illustrated in FIG. 2B, is obtained. The waveform 220 is a plot of the output signal 214 (in voltage units (e.g., volts) along the axis 222 versus time units (e.g., seconds) along axis 224). For purposes of illustration, the following exemplary amplitude levels are listed along the axis 222: −0.25, 0.0, 0.25, 0.5, 0.75, 1.0, 1.25, 1.5 and 1.75 volts (V). Additionally, for purposes of illustration, the following exemplary points in time are listed along the axis 224: 0, 2, 4, 6, 8, 10, 12, 14 and 16 seconds (s). The waveform 220 of the output signal 214 is a function of the output impedance 'R' of the I/O circuit 202 and the predetermined delay "d" generated based on the compensated delay code 210. R is determined by the number of I/O slices turned ON or activated based on the PTV code 216. As in the example explained earlier with reference to FIG. 2A, upon turning ON or activating the first slice group 206a, the output signal rises along the edge 226a. The slope of the edge is determined by the value of R.

The second slice group 206b is subsequently turned ON or activated after the delay d represented by an edge 228a. After the lapse of the d seconds, when the second slice group 206b is turned ON or activated, the output signal 214 rises along an edge 226b. Subsequently, after the lapse of d seconds represented by an edge 228b, the third slice group 206c is turned ON or activated. Upon turning ON or activating the third slice group 206c, the output signal rises along an edge 226c. Similarly, an edge 228c corresponds to a subsequent delay d and an edge 226d corresponds to the output signal 214 upon the turning ON or activation of the fourth slice group 206d. By suitably changing the compensated delay code 210 and the PTV code 216, the delay d and impedance R values may respectively be changed, thereby allowing a programming of the slew rate of the I/O circuit 202.

Figure 3:
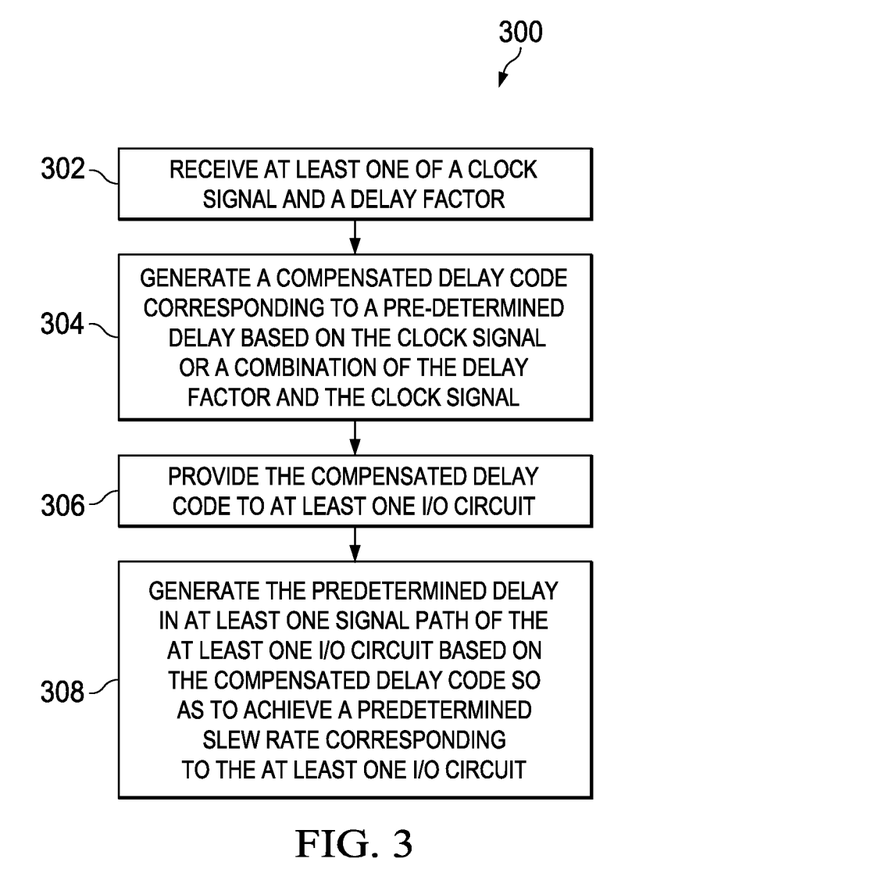
FIG. 3 is a flow chart of an exemplary method of enabling a slew rate programmability and compensation of an I/O circuit, according to an embodiment.

FIG. 3 is a flow chart of an exemplary method 300 of enabling a slew rate programmability and compensation of an I/O circuit according to an embodiment. As illustrated in FIG. 3, in operation 302, a clock signal and a delay factor are received in, for example, a delay code generation circuit (e.g., delay code generation circuit 102 of FIG. 1). Examples of the delay code generation circuit may include, but are not limited to, a delay locked loop, a delay line, a plurality of delay lines connected or coupled in series, and the like. In an embodiment, the delay factor is associated with a clock period of the clock signal and a predetermined delay associated with a predetermined slew rate of an I/O circuit. Examples of the delay factor include, but are not limited to, a division factor and a multiplying factor. In an embodiment, the clock signal is divided and fed into the delay code generation circuit so as to overcome duty cycle issues. In an embodiment, the clock signal is divided by 2 and fed into the delay code generation circuit.

In an embodiment, in operation 304, a compensated delay code corresponding to the predetermined delay is generated based on the clock signal or a combination of the delay factor and the clock signal. In an embodiment, the compensated delay code compensates for at least one of a process variation, a temperature variation, and a voltage variation. In an embodiment, the compensated delay code is a binary code. The compensated delay code is generated through the delay code generation circuit so as to provide the compensated delay code to the I/O circuit (e.g., I/O circuit 104a-104n of FIG. 1 or I/O circuit 202 of FIG. 2A) communicatively associated, integrated or coupled with the delay code generation circuit. Examples of the I/O circuit may include, but are not limited to, an I/O driver. In an embodiment, in order to generate the compensated delay code, the delay code generation circuit is calibrated so as to provide a plurality of delays based on the process variation, the temperature variation, and/or the voltage variation. The plurality of delays generated are process, temperature, and/or voltage compensated. A plurality of compensated delay codes may be generated based on the plurality of delays. In an embodiment, at least one of a clock period of the clock signal and the delay factor is adjusted so as to generate the compensated delay code corresponding to the predetermined delay. The predetermined delay is a ratio of the clock period of the clock signal and the delay factor.

In an embodiment, in operation 306, the compensated delay code is provided to the I/O circuit. In an embodiment, the generated compensated delay code is decoded. The decoded compensated delay code is provided to a slave delay circuit of the I/O circuit. In an embodiment, the compensated delay code is modified (e.g. scaled) based on the delay factor and the modified delay (e.g., scaled delay) is provided to the slave delay circuit. In an embodiment, the compensated delay code is modified (e.g. scaled) prior to decoding the compensated delay code. In an embodiment, the compensated delay code is directly fed into the slave delay circuit of the I/O circuit. In an embodiment, the clock signal is divided to derive a code update signal. The compensated delay code or the decoded compensated delay code is fed into the slave delay circuit along with the code update signal. The compensated delay code is generated during a falling edge of the code update signal and the compensated delay code is captured by the I/O circuit during a rising edge of the code update signal. In an embodiment, the compensated delay code is updated during every subsequent falling edge from among a plurality of falling edges of the code update signal.

In an embodiment, in operation 308, the predetermined delay is generated in at least one signal path of the I/O circuit based on the compensated delay code so as to achieve the predetermined slew rate of the I/O circuit based on the predetermined delay or a combination of an impedance of the I/O circuit and the predetermined delay. The predetermined slew rate is compensated for at least one of a process variation, a temperature variation, and a voltage variation as the compensated delay code is generated based on at least one of the process variation, the temperature variation, and the voltage variation. Each signal path of the I/O circuit is defined by a slice group of the I/O circuit including one or more I/O slices. Upon receiving the compensated delay code, one or more delay elements within each delay line from among a plurality of delay lines of a slave delay circuit of the I/O circuit are turned ON or activated based on the compensated delay code so as to generate the predetermined delay through each of the plurality of delay lines. Consecutive slice groups from among a plurality of slice groups of the I/O circuit are turned ON or activated successively after the predetermined delay, or a multiple of the predetermined delay, so as to achieve the predetermined slew rate as explained in the description of FIGS. 2A and 2B.

In an embodiment, a PTV code is received by the I/O circuit in addition to the compensated delay code so as to vary an impedance of the I/O circuit. One or more of a plurality of I/O slices of the I/O circuit to be turned ON or activated are selected based on the received PTV code. In an embodiment, a selection code is generated based on the PTV code and the drive strength setting. The number of I/O slices to be activated/tuned ON to thereby vary the impedance of the I/O circuit is selected based on the selection code. It is noted that the terminology "drive strength" may be construed as referring to a maximum current that a pin of the I/O circuit is able to drive. In an embodiment, the selection code is a binary code. In an embodiment, the PTV code is an e-fuse code. The drive strength of the I/O circuit may be process compensated based on the PTV code. In an embodiment, the separate PTV codes are provided for PMOS transistor based I/O slices and NMOS transistor based slices.

In an embodiment, one or more of the plurality of I/O slices to be turned ON or activated are determined based on the generated selection code, thereby providing separate process compensation for PMOS transistor based I/O slices and NMOS transistor based I/O slices. The slew rate of the I/O circuit is process, temperature, and/or voltage compensated and programmable based on the compensated delay code and the selection code as explained herein with reference to FIGS. 2A and 2B.

Without in any way limiting the scope, interpretation, or application of the claims appearing below, advantages of one or more of the exemplary embodiments disclosed herein include a wide range slew rate programmability of I/O circuits. Various embodiments of the present technology also enable slow transition rates when compared to other exemplary techniques. Also, various embodiments of the present technology enable EMI issues associated with the I/O circuit to be overcome. Furthermore, various embodiments of the present technology provide a low cost solution due to the utilization of the clock signal available on chip without the implementation of an external pulse input. As the clock signal is divided and used, several duty cycle issues are overcome in various embodiments of the present technology.

Additionally, various embodiments of the present technology enable the replacement of an entire I/O library (which may include, for example, thirty I/Os) with a single I/O circuit, thereby leading to low cost library development. Also, various embodiments of the present technology do not use an external resistor for process, temperature, and voltage compensation of the compensated delay code and provide separate compensation for PMOS and NMOS. Moreover, various embodiments of the present technology allow (1) a lower amount of surface area to be utilized and (2) a better overshoot/undershoot slew rate and performance to be achieved when compared to several other exemplary techniques.

Although the present technology has been described with reference to specific exemplary embodiments, it is noted that various modifications and changes is made to these embodiments without departing from the broad spirit and scope of the present technology. For example, the various devices, modules, analyzers, generators, etc., described herein is enabled and operated using hardware circuitry (e.g., a complementary metal oxide semiconductor (CMOS) based logic circuitry), and/or any combination of hardware and software (e.g., embodied in a machine readable medium). For example, the various electrical structures may be embodied using transistors, logic gates, and electrical circuits (e.g., ASIC circuitry and/or in Digital Signal Processor (DSP) circuitry) and drawings are to be regarded in an illustrative rather than a restrictive sense.

Also, the circuits described and illustrated in the various embodiments as discrete or separate is combined or integrated with other systems, modules, without departing from the scope of the present technology. Other items shown or discussed as directly coupled or communicating with each other is coupled through some interface or device, such that the items may no longer be considered directly coupled to each other but may still be indirectly coupled and in communication, whether electrically, mechanically, or otherwise, with one another. Other examples of changes, substitutions, and alterations ascertainable by one skilled in the art, upon studying the exemplary embodiments disclosed herein, may be made without departing from the spirit and scope of the present technology.

What is claimed is:

1. A circuit comprising:
    a delay code generation circuit configured to receive a clock signal and a delay factor and generate a compensated delay code based on the clock signal or a combination of the clock signal and the delay factor; and
    at least one input/output (I/O) circuit comprising a plurality of delay lines and communicatively associated with the delay code generation circuit, the at least one I/O circuit configured to receive the compensated delay code and program the plurality of delay lines to generate a predetermined delay corresponding to the compensated delay code so as to achieve a predetermined slew rate corresponding to the at least one I/O circuit.

2. The circuit of claim 1, wherein the at least one I/O circuit comprises:
    a slave delay circuit comprising the plurality of delay lines configured to generate the predetermined delay corresponding to the compensated delay code; and
    at least one I/O slice communicatively associated with the slave delay circuit and configured to generate the predetermined slew rate based on the predetermined delay.

3. The circuit of claim 1, wherein the compensated delay code compensates for at least one of a process variation, a temperature variation, and a voltage variation.

4. The circuit of claim 2, further comprising:
    a drive strength block communicatively associated with the at least one I/O circuit and configured to provide a selection code so as to enable a selection of a number of I/O slices to vary an impedance of the at least one I/O circuit.

5. The circuit of claim 4, wherein the drive strength block is configured to receive a process temperature voltage code for generating the selection code, wherein the process temperature voltage code compensates for at least one of a process variation, a temperature variation, and a voltage variation.

6. The circuit of claim 1, wherein the delay code generation circuit comprises a delay locked loop comprising a plurality of delay lines.

7. The circuit of claim 1, wherein the compensated delay code is a binary code.

8. A circuit comprising:
    a delay code generation circuit configured to receive a clock signal and a delay factor and generate a compensated delay code based on the clock signal or a combination of the delay factor and the clock signal; and
    at least one I/O circuit communicatively associated with the delay code generation circuit and configured to receive the compensated delay code, the at least one I/O circuit comprising:

a slave delay circuit comprising a plurality of delay lines, each of the plurality of delay lines being configured to generate a predetermined delay corresponding to the compensated delay code; and an I/O block communicatively associated with the slave delay circuit and configured to generate a predetermined slew rate, the I/O block comprising:
a plurality of slice groups each comprising at least one I/O slice configured to be activated based on an input from a delay line from among the plurality of delay lines.

9. The circuit of claim 8, wherein each slice group from among the plurality of slice groups is associated with a distinct delay based on the input from a delay line from among the plurality of delay lines, the plurality of slice groups being configured in a serial manner.

10. The circuit of claim 8, wherein the at least one I/O circuit further comprises a drive strength block communicatively associated with the I/O block and configured to provide a selection code so as to enable a selection of a number of I/O slices to vary an impedance of the I/O circuit.

11. The circuit of claim 10, wherein the drive strength block is configured to receive a process temperature voltage code for generating the selection code, wherein the process temperature voltage code compensates for at least one of a process variation, a temperature variation, and a voltage variation.

12. The circuit of claim 10, wherein each I/O slice receives the selection code generated from the drive strength block and generates an output signal.

13. The circuit of claim 8, wherein the compensated delay code is a binary code.

14. A method comprising:
receiving at least one of a clock signal and a delay factor;
generating a compensated delay code corresponding to a predetermined delay based on the clock signal or a combination of the delay factor and the clock signal;
providing the compensated delay code to at least one I/O circuit; and
generating the predetermined delay in at least one signal path of the at least one I/O circuit based on the compensated delay code so as to achieve a predetermined slew rate corresponding to the at least one I/O circuit.

15. The method of claim 14, wherein generating the compensated delay code comprises:
calibrating the delay code generation circuit to provide a plurality of delays based on at least one of a process variation, a temperature variation, and a voltage variation; and
adjusting at least one of a clock period of the clock signal and the delay factor so as to generate the compensated delay code corresponding to the predetermined delay based on the calibration, the predetermined delay being a ratio of the clock period and the delay factor.

16. The method of claim 14, further comprising:
receiving a process temperature voltage code by the at least one I/O circuit so as to vary the impedance of the at least one I/O circuit, wherein the process temperature voltage code compensates for at least one of the process variation, the temperature variation, and the voltage variation; and
selecting one or more of a plurality of I/O slices of the at least one I/O circuit to be activated based on the received process temperature voltage code.

17. The method of claim 16, wherein the selecting comprises:
generating a selection code based on the process temperature voltage code and a drive strength setting so as to select a number of I/O slices to thereby vary the impedance of the at least one I/O circuit; and
determining the one or more of the plurality of I/O slices to be activated based on the generated selection code.

18. The method of claim 14, further comprising:
decoding the compensated delay code; and
providing the decoded compensated delay code to a slave delay circuit of the at least one I/O circuit.

19. The method of claim 18, further comprising:
modifying the compensated delay code based on a delay factor prior to the decoding.

20. The method of claim 18, further comprising:
deriving a code update signal from the clock signal; and
providing the code update signal to the slave delay circuit along with the compensated delay code, the compensated delay code being updated during each falling edge of the code update signal.

* * * * *